(12) United States Patent
Wang

(10) Patent No.: US 6,555,744 B1
(45) Date of Patent: Apr. 29, 2003

(54) SHIELDING DEVICE FOR REDUCING ELECTROMAGNETIC EMISSIONS

(75) Inventor: Sheng-Horng Wang, Taipei (TW)

(73) Assignee: Mitac International Corp. (TW)

( * ) Notice: Subject to any disclaimer, the term of this patent is extended or adjusted under 35 U.S.C. 154(b) by 0 days.

(21) Appl. No.: 10/014,468

(22) Filed: Dec. 14, 2001

(51) Int. Cl.[7] ................................................ H05K 9/00
(52) U.S. Cl. ........................... 174/35 GC; 174/35 R; 361/816; 361/818; 277/920
(58) Field of Search ................. 174/35 GC, 35 R; 361/753, 799, 800, 816, 818; 277/920; 439/607, 609, 927

(56) References Cited

U.S. PATENT DOCUMENTS

| | | | |
|---|---|---|---|
| 4,817,337 A | * 4/1989 | Lahita | 49/483.1 |
| 5,327,324 A | * 7/1994 | Roth | 361/707 |
| 5,513,996 A | * 5/1996 | Annerino et al. | 439/95 |
| 6,307,155 B1 | * 10/2001 | Permuy | 174/52.1 |

* cited by examiner

Primary Examiner—Dean A. Reichard
Assistant Examiner—Carmelo Oliva
(74) Attorney, Agent, or Firm—Lowe Hauptman Gilman & Berner, LLP

(57) ABSTRACT

A shielding device for reducing electromagnetic emissions from an electronic device includes an abutment segment adapted to abut against a shielding wall of the electronic device, an intermediate segment extending from the abutment segment and cooperating with the abutment segment to define a space for receiving an electrically conductive deformable member, and a shielding segment extending from the intermediate segment to shield a clearance between the shielding wall and an electronic component mounted adjacent to an opening in the shielding wall.

6 Claims, 4 Drawing Sheets

SHIELDING DEVICE FOR REDUCING ELECTROMAGNETIC EMISSIONS

BACKGROUND OF THE INVENTION

1. Field of the Invention

The invention relates to a shielding device, more particularly to a shielding device that can effectively reduce electromagnetic emissions from an electronic device and that has enhanced strength and resiliency.

2. Description of the Related Art

With the progress of electronic information technology and the manufacturing industry, computers have become indispensable tools for the modern people. A typical personal computer generally has a number of peripheral devices connected thereto.

Referring to FIGS. 1 to 4, chambers 10, 11 are provided in a front side of a computer housing 1 of a computer to receive disk drives, such as compact disk drives, floppy disk drives, hard disk drives, or the like. A gap 13 is generally formed between outer wall surfaces of the disk drives and parts of the housing 1 that confine the chambers 10, 11 after assembly. A gap 13 is also usually present between the housing 1 and a rear panel 12 that is mounted on the housing 1 for connection with external peripheral devices. As such, electromagnetic radiation produced by the computer during operation may escape through the gaps 13. Electromagnetic emissions from the computer have adverse effects on adjacent electronic devices and the user. Shielding devices commonly adopted by the industry include a plastic strip 15 having a conductive ribbon 14 extending therethrough. The plastic strip 15 together with the conductive ribbon 14 is disposed in the gap 13, such as that shown in FIG. 1. Alternatively, a sponge 17 wrapped in a metal screen 16 is squeezed into a space upstream of the gap 13, as shown in FIG. 3. The plastic strip 15 with the conductive ribbon 14 is disadvantageous in that it is inconvenient to install and replace. As for the sponge 17, it is too soft and is liable to deform when squeezed so that it may not completely fill the space. Furthermore, the aforesaid shielding devices are relatively expensive to manufacture and complicated to install. Besides, they cannot effectively prevent electromagnetic emissions. As is well known, prolonged exposure to electromagnetic radiation is detrimental to health. On the other hand, electromagnetic emissions from adjacent electronic devices may enter the housing 1 through the gaps 13 to interfere with the operation of the computer or even result in shutdown of the computer.

SUMMARY OF THE INVENTION

Therefore, the main object of the present invention is to provide a shielding device that can effectively reduce electromagnetic emissions from an electronic device and that has enhanced strength and resiliency.

Accordingly, a shielding device of the present invention is adapted to reduce electromagnetic emissions from an electronic device which includes an electronic component, an electrically conductive housing that houses the electronic component and that includes a shielding wall with opposite inner and outer shielding wall surfaces, the outer shielding wall surface having an access opening extending to communicate with the inner shielding wall surface so as to expose the electronic component from the outside of the electronic device, and a mounting member that is disposed to mount the electronic component relative to the inner shielding wall surface and that includes a mounting wall forming a clearance with the inner shielding wall surface as a result of anchoring attachment between the mounting member and the inner shielding wall surface. The shielding device includes:

an abutment segment extending in a longitudinal direction and having an inner abutment surface, and an outer abutment surface opposite to the inner abutment surface in a transverse direction that is transverse to the longitudinal direction, the outer abutment surface being adapted to abut against one of the mounting member and the inner shielding wall surface;

an intermediate segment extending from the abutment segment and terminating at a distal end, the intermediate segment having an intermediate inner surface spaced apart from the inner abutment surface in the transverse direction to confine a compressible space therebetween, and an intermediate outer surface opposite to the intermediate inner surface in the transverse direction and joining the intermediate inner surface at the distal end;

a shielding segment extending from the distal end and terminating at an engaging portion which is spaced apart from the intermediate segment in the transverse direction by a route for passage of possible electromagnetic emissions and which is adapted to engage the other one of the mounting member and the inner shielding wall surface so as to shield the clearance from the route, the shielding segment, the abutment segment and the intermediate segment being formed from an electrically conductive material; and an electrically conductive deformable member having opposite first and second force bearing surfaces, the deformable member being received in the compressible space such that the first and second force bearing surfaces respectively abut against the intermediate inner surface and the inner abutment surface, thereby enhancing strength and resiliency of the intermediate segment and the abutment segment.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
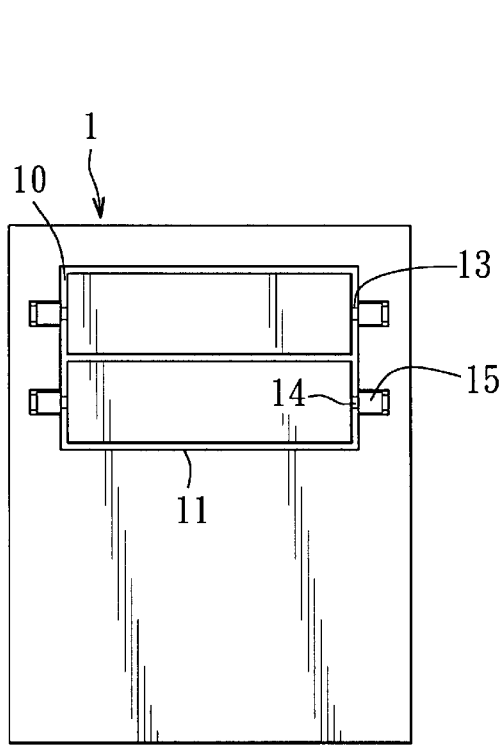
FIG. 1 is a fragmentary perspective view illustrating how a conventional shielding device is installed in a computer housing.
Figure 2:
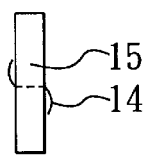
FIG. 2 is a fragmentary schematic view showing the conventional shielding device of FIG. 1.
Figure 3:
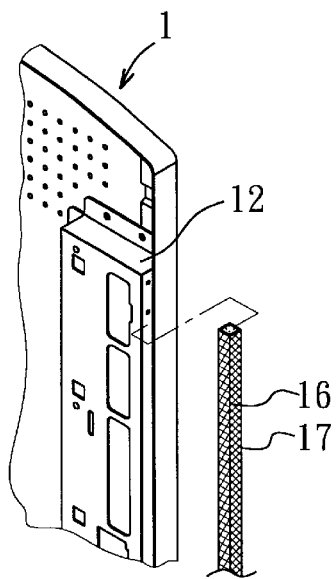
FIG. 3 is a fragmentary schematic view illustrating how another conventional shielding device is to be installed in the computer housing.
Figure 4:
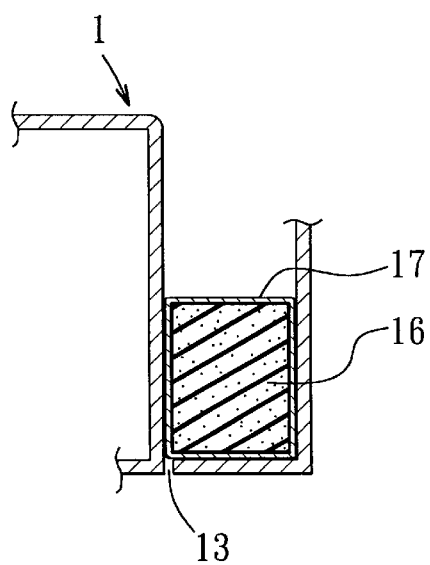
FIG. 4 is a fragmentary schematic sectional view illustrating how the conventional shielding device of FIG. 3 is installed in the computer housing.

Before the present invention is described in greater detail, it should be noted that like elements are denoted by the same reference numerals throughout the disclosure.

Figure 6:
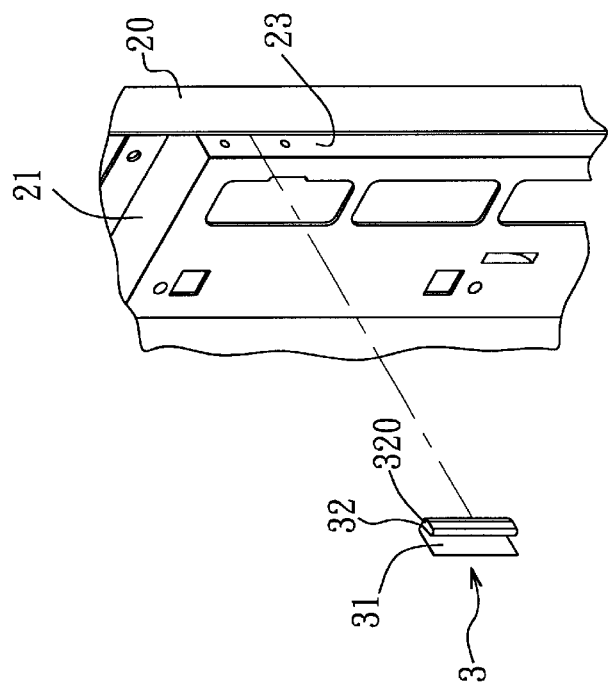
FIG. 6 is an enlarged view of an encircled portion of FIG. 5.
Figure 5:
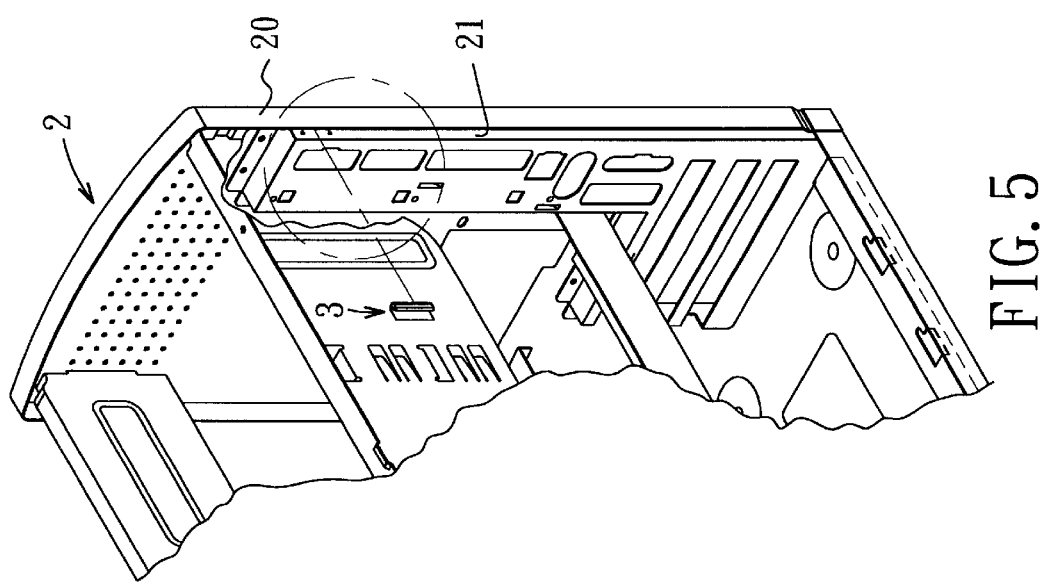
FIG. 5 is a fragmentary perspective view illustrating how the first preferred embodiment of a shielding device of this invention is assembled to a housing of a computer.
Figure 7:
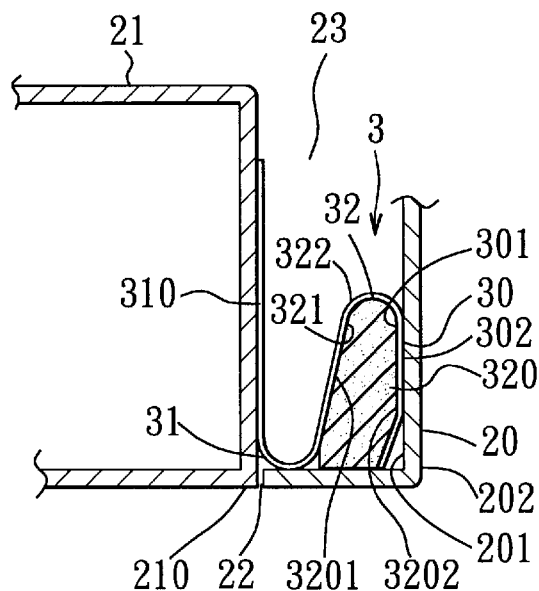
FIG. 7 is a fragmentary schematic sectional view of the first preferred embodiment in a mounted state.

Referring to FIGS. 5 to 7, the first preferred embodiment of a shielding device 3 according to the present invention is shown to be adapted for use in an electronic device, such as a personal computer, to reduce electromagnetic emissions therefrom. The electronic device includes an electrically conductive housing 2 which houses an electronic component (not shown), and which includes a shielding wall 20 with opposite inner and outer shielding wall surfaces 201, 202. The outer shielding wall surface 202 has an access opening (not visible) extending to communicate with the inner shielding wall surface 201 so as to expose the electronic component from the outside of the electronic device. A mounting member 21 is disposed to mount the electronic component relative to the inner shielding wall surface 201, and includes a mounting wall 210 forming a clearance 22 with the inner shielding wall surface 201 (see FIG. 7) as a result of anchoring attachment between the mounting member 21 and the inner shielding wall surface 201. A gap 23 is also formed between the mounting member 21 and the inner shielding wall surface 201.

As shown, the shielding device 3 has a generally S-shaped cross section, and is adapted to be disposed in the gap 23. The shielding device 3 includes an abutment segment 30, an intermediate segment 32 and a shielding segment 31. The abutment segment 30 extends in a longitudinal direction, and has an inner abutment surface 301 and an outer abutment surface 302 opposite to the inner abutment surface 301 in a transverse direction that is transverse to the longitudinal direction. In this embodiment, the outer abutment surface 302 is adapted to abut against the inner shielding wall surface 201, and has a generally planar surface.

The intermediate segment 32 extends from the abutment segment 30, and terminates at a distal end. The intermediate segment 32 has an intermediate inner surface 321 spaced apart from the inner abutment surface 301 in the transverse direction to confine a compressible space therebetween, and an intermediate outer surface 322 opposite to the intermediate inner surface 321 in the transverse direction and joining the intermediate inner surface 321 at the distal end.

The shielding segment 31 extends from the distal end, and terminates at a substantially planar engaging portion 310 which is spaced apart from the intermediate segment 32 in the transverse direction by a route for passage of possible electromagnetic emissions, and which is adapted to engage the mounting member 21 so as to shield the clearance 22 from the route. The shielding segment 31, the abutment segment 30 and the intermediate segment 32 are integrally formed from an electrically conductive material.

An electrically conductive deformable member 320 is received in the compressible space, and has first and second force bearing surfaces 3201, 3202 such that the first and second force bearing surfaces 3201, 3202 respectively abut against the intermediate inner surface 321 and the inner abutment surface 301.

In the invention, in order to enhance bonding strength between the deformable member 320 and the intermediate and abutment segments 32, 30, respectively, adhesives are respectively applied to the first force bearing surface 3201 and the intermediate inner surface 321, and to the second force bearing surface 3202 and the inner abutment surface 301, respectively. In addition, due to the use of the adhesives, in case of breaking of the shielding device 3 in a state of use, broken parts of the shielding device 3 can remain attached to the deformable member 320 to sustain the function of the shielding device 3, and will not drop into the housing 2 so as not to cause possible damage to other electronic components inside the housing 2.

Figure 9:
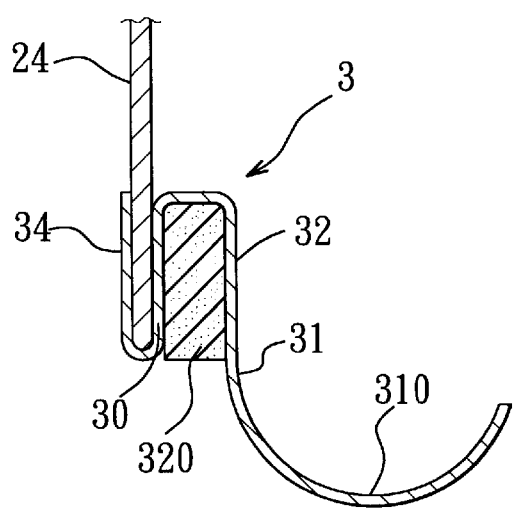
FIG. 9 is a fragmentary schematic sectional view showing how the second preferred embodiment is mounted to a wall portion of the computer housing.
Figure 8:
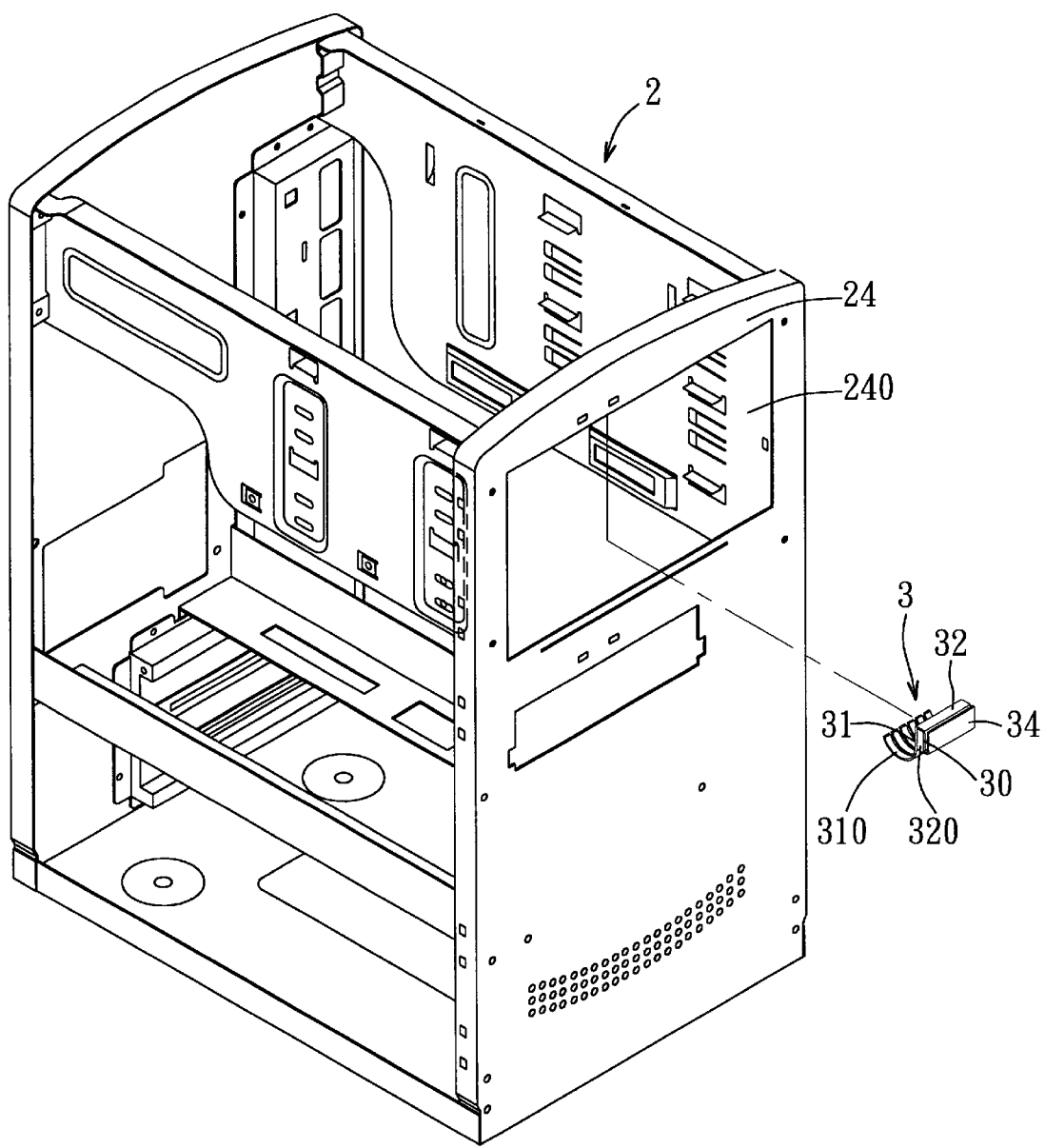
FIG. 8 is a perspective view illustrating how the second preferred embodiment of a shielding device according to the present invention is mounted to a computer housing.

Referring to FIGS. 8 and 9, the second preferred embodiment of the shielding device 3 according to the present invention is shown to further include a clamping segment 34 that extends inwardly from the abutment segment 30 opposite to the intermediate segment 32, and that is spaced apart from the abutment segment 30 in the transverse direction such that the clamping segment 34 is urged toward the abutment segment 30. In use, the abutment segment 30 and the clamping segment 34 are adapted to clamp a wall portion 24 of the shielding wall 20 which confines a disk drive receiving space 240 formed in a front side of the housing 2. In this embodiment, the engaging portion 310 of the shielding segment 31 curves outwardly with respect to the intermediate segment 32 so as to be adapted to resiliently abut against an upper casing surface of a disk drive (not shown) inserted into the disk drive receiving space 240, thereby preventing escape of electromagnetic emissions via a clearance between the disk drive and the wall portion 24.

It is noted that, although the shielding device 3 is shown to have a generally S-shaped cross section in the preferred embodiments, it can have any suitable configuration so long as it can achieve the same shielding effect.

In the present invention, due to the disposition of the deformable member 320, the resiliency and strength of both the intermediate segment 32 and the abutment segment 30 can be enhanced to effectively prevent escape of electromagnetic emissions from the housing 2. Besides, the deformable member 320 is convenient to assemble to help reduce production costs.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A shielding device for reducing electromagnetic emissions from an electronic device which includes an electronic component, an electrically conductive housing that houses the electronic component and that includes a shielding wall with opposite inner and outer shielding wall surfaces, the outer shielding wall surface having an access opening extending to communicate with the inner shielding wall surface so as to expose the electronic component from the outside of the electronic device, and a mounting member that is disposed to mount the electronic component relative to the inner shielding wall surface and that includes a mounting wall forming a clearance with the inner shielding wall surface as a result of anchoring attachment between the mounting member and the inner shielding wall surface, said shielding device comprising:

an abutment segment extending in a longitudinal direction and having an inner abutment surface, and an outer abutment surface opposite to said inner abutment surface in a transverse direction that is transverse to the longitudinal direction, said outer abutment surface being adapted to abut against one of the mounting member and the inner shielding wall surface;

an intermediate segment extending from said abutment segment and terminating at a distal end, said intermediate segment having an intermediate inner surface spaced apart from said inner abutment surface in the transverse direction to confine a compressible space therebetween, and an intermediate outer surface opposite to said intermediate inner surface in the transverse direction and joining said intermediate inner surface at said distal end;

a shielding segment extending from said distal end and terminating at an engaging portion which is spaced apart from said intermediate segment in the transverse direction by a route for passage of possible electromagnetic emissions and which is adapted to engage the other one of the mounting member and the inner shielding wall surface so as to shield the clearance from the route, said shielding segment, said abutment segment and said intermediate segment being formed from an electrically conductive material; and an electrically conductive deformable member having opposite first and second force bearing surfaces, said deformable member being received in said compressible space such that said first and second force bearing surfaces respectively abut against said intermediate inner surface and said inner abutment surface, thereby enhancing strength and resiliency of said intermediate segment and said abutment segment.

2. The shielding device as claimed in claim 1, further comprising an adhesive layer interposed between one of said first and second force bearing surfaces and one of said intermediate inner surface and said inner abutment surface so as to enhance bonding strength therebetween.

3. The shielding device as claimed in claim 1, wherein said abutment segment is adapted to abut against the inner shielding wall surface, and said engaging portion is adapted to engage the mounting member.

4. The shielding device as claimed in claim 3, further comprising a clamping segment that extends inwardly from said abutment segment opposite to said intermediate segment, and that is spaced apart from said abutment segment in the transverse direction such that said clamping segment is urged toward said abutment segment, said abutment segment and said clamping segment being adapted to clamp the shielding wall therebetween.

5. The shielding device as claimed in claim 4, wherein said abutment segment, said intermediate segment, said shielding segment, and said clamping segment are integrally formed.

6. The shielding device as claimed in claim 1, wherein said shielding device has a generally S-shaped cross section.

* * * * *